US012689368B2

(12) United States Patent
Hohmann

(10) Patent No.: US 12,689,368 B2
(45) Date of Patent: Jul. 21, 2026

(54) PROCESS FOR ACTIVATING A CIRCUIT ARRANGEMENT FOR POWER SEMICONDUCTORS OF AN INVERTER, AND CIRCUIT ARRANGEMENT

(71) Applicant: ZF Friedrichshafen AG, Friedrichshafen (DE)

(72) Inventor: Fabian Hohmann, Hofbieber (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 18/365,780

(22) Filed: Aug. 4, 2023

(65) Prior Publication Data

US 2024/0048141 A1 Feb. 8, 2024

(30) Foreign Application Priority Data

Aug. 4, 2022 (DE) .......................... 102022208138.2

(51) Int. Cl.
| | |
|---|---|
| *H03K 17/687* | (2006.01) |
| *H02M 1/00* | (2006.01) |
| *H03K 17/16* | (2006.01) |

(52) U.S. Cl.
CPC ........ *H03K 17/687* (2013.01); *H02M 1/0054* (2021.05); *H03K 17/162* (2013.01)

(58) Field of Classification Search
None
See application file for complete search history.

(56) References Cited

U.S. PATENT DOCUMENTS

| | | | | |
|---|---|---|---|---|
| 5,959,481 | A * | 9/1999 | Donnelly | G06F 13/4072 |
| | | | | 327/170 |
| 7,741,883 | B2 * | 6/2010 | Fuller | H03K 17/284 |
| | | | | 327/108 |
| 9,484,908 | B1 | 11/2016 | Lu et al. | |
| 10,033,378 | B2 * | 7/2018 | Turvey | H03K 17/122 |
| 10,050,105 | B2 * | 8/2018 | Shirakawa | H01L 27/0629 |
| 10,447,259 | B2 * | 10/2019 | Kamiya | H03K 17/127 |
| 10,541,681 | B2 * | 1/2020 | Asako | H03K 17/127 |
| 10,715,053 | B2 * | 7/2020 | Kimura | H02M 1/08 |

(Continued)

FOREIGN PATENT DOCUMENTS

| | | |
|---|---|---|
| DE | 10 2012 207 222 A1 | 11/2012 |
| DE | 10 2013 108 078 A1 | 1/2015 |

(Continued)

OTHER PUBLICATIONS

Office Action dated Mar. 13, 2023 for German Patent Application No. 10 2022 208 138.2 (22 pp.), note: pp. 1 and 2 are English language Explanations to Section C. Result of Determination Document.

*Primary Examiner* — Kenneth B Wells

(74) *Attorney, Agent, or Firm* — Crowell & Moring LLP

(57) ABSTRACT

A method for activating a circuit arrangement for power semiconductors of an inverter with at least one phase, having at least two power semiconductors, which are connected in parallel with one another, wherein the power semiconductors are divided into two groups, of which at least one first group has a separate driver, and wherein the activation of the power semiconductors takes place in such a manner that during the switch-on operation, initially the first group and subsequently the second group is switched on.

13 Claims, 1 Drawing Sheet

(56) References Cited

U.S. PATENT DOCUMENTS

| 10,797,036 B2 * | 10/2020 | Nagase | ................. H01L 25/072 |
| 10,831,225 B2 * | 11/2020 | Araragi | ............ H02M 7/53875 |
| 2012/0307540 A1 | 12/2012 | Tagome | |
| 2017/0019097 A1 | 1/2017 | Sato | |
| 2021/0376824 A1 | 12/2021 | Liu | |

FOREIGN PATENT DOCUMENTS

| DE | 10 2014 224 172 A1 | 6/2016 |
| DE | 11 2017 003 652 T5 | 4/2019 |
| DE | 10 2019 102 371 A1 | 7/2020 |
| DE | 10 2020 102 560 A1 | 8/2021 |
| JP | 2019-24312 | 2/2019 |

* cited by examiner

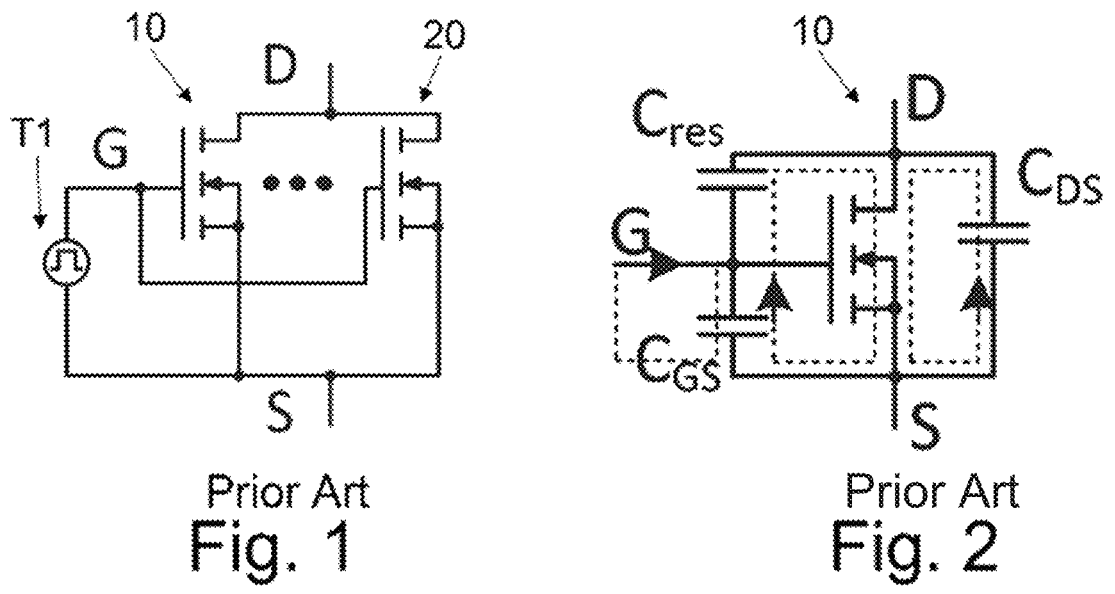
Prior Art
Fig. 1
Prior Art
Fig. 2
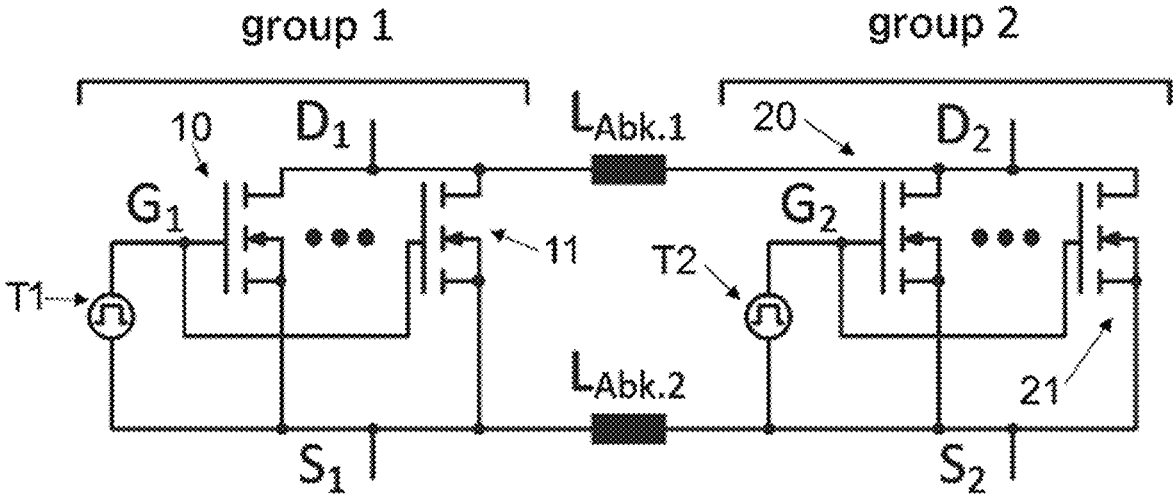
Fig. 3

PROCESS FOR ACTIVATING A CIRCUIT ARRANGEMENT FOR POWER SEMICONDUCTORS OF AN INVERTER, AND CIRCUIT ARRANGEMENT

CROSS-REFERENCE TO RELATED APPLICATION

This application claims priority to German Application No. DE 10 2022 208 138.2, filed on Aug. 4, 2022, the entirety of which is hereby fully incorporated by reference herein.

FIELD

The present invention relates to the field of electromobility, particularly electronic modules for an electric drive.

BACKGROUND AND SUMMARY

The use of electronic modules, for example power electronics modules, in motor vehicles has increased sharply in recent decades. This can be attributed firstly to necessity to improve fuel saving and vehicle performance and secondly to the advances in semiconductor technology. The main constituent of such an electronic module is a DC/AC inverter, which is used to supply a polyphase alternating current (AC) to electric machines, such as electric motors or generators. In this case, a direct current generated by means of a DC energy source, for example a battery or a rechargeable battery, is converted into a polyphase alternating current. For this purpose, the inverters comprise a multiplicity of electric components, using which bridge circuits (such as half bridges) are realized, for example semiconductor power switches, which are also termed power semiconductors.

A common method for increasing the output of inverters is the parallel connection of power semiconductors, e.g. SiC-MOSFET, IGBT and parallel-connected freewheeling diode (also termed anti-parallel silicon diode). Currently, silicon carbide power semiconductors, which are connected in parallel for adaptation to the performance, are increasingly being used for traction converters. These parallel-connected power semiconductors form a topological switch and are activated using a driver. Each individual power semiconductor has parasitic capacitances. These parasitic capacitances must be subjected to charge reversal during each switching operation. In the switch-on operation, virtually the entire DC link voltage is applied, which leads to losses. The losses reduce the efficiency and the range of battery electric vehicles.

An object of the invention is therefore to provide a process for activating a circuit arrangement for power semiconductors and a circuit arrangement, by means of which a reduction of the switching energy losses of the output capacitance is achieved.

This object is achieved by the features as described herein. Advantageous embodiments are also the subject of the present disclosure.

A process is proposed for activating a circuit arrangement for power semiconductors of an inverter with at least one phase, having at least two power semiconductors, which are connected in parallel with one another, wherein the power semiconductors are divided into two groups, of which at least one first group has a separate driver, and wherein the activation of the power semiconductors takes place in such a manner that during the switch-on operation, initially the first group and subsequently the second group is switched on (discharged with regard to the output capacitances of the semiconductor).

In an embodiment, initially the driver of the first group is switched to a positive supply voltage, so that the power semiconductors of the first group are switched on, and subsequently, owing to decoupling inductances provided between the first and the second group, the power semiconductors of the second group are switched on.

In an embodiment, the second group has a separate driver and/or a passive network, which brings about a delay of the activation of the second group.

In an embodiment, each driver provides a dynamic activation, depending on the operating point of the circuit.

Furthermore, a circuit arrangement is provided, which is part of an inverter of an electronic module for activating the electric drive of a vehicle equipped with an electric drive, according to that described, and has at least two power semiconductors, which are connected in parallel with one another, wherein the power semiconductors are divided into two groups, of which a first group has a separate driver and the second group has a separate driver or is connected to a passive network, which is formed in such a manner that the network provides a delay of the activation of the second group.

In an embodiment, the power semiconductors of the first group are connected in the commutating circuit with low impedance.

In an embodiment, the first group is coupled to the second group via decoupling inductances.

Furthermore, an inverter having the circuit arrangement is provided, and an electric drive of a vehicle is provided, having an electronic module for activating the electric drive, which comprises the inverter. In addition, a vehicle having an electric drive is provided.

Further features and advantages of the invention can be found in the following description of exemplary embodiments of the invention, with reference to the figures of the drawings, which shows details according to the invention, and in the claims. The individual features may each be realized individually separately or as a plurality of features in any desired combination in a variant of the invention.

Preferred embodiments of the invention are explained in more detail in the following with reference to the drawings.

BRIEF DESCRIPTION OF THE DRAWINGS

FIG. 1 shows a basic structure of a topological switch with driver according to the prior art.

FIG. 2 shows parasitic capacitances Cres, CDS, CGS on the basis of a power semiconductor shown in FIG. 1, which are subjected to charge reversal during each switching operation.

FIG. 3 shows an embodiment of the circuit arrangement according to an embodiment of the present invention.

DETAILED DESCRIPTION

In the following descriptions of the figures, identical elements or functions are provided with identical reference signs.

As already mentioned in the introduction, one aim of the design of circuits for power semiconductors of an inverter in the automotive sector is to generate as few switching losses as possible. This can be achieved up to a certain extent, by an intelligent circuit arrangement and choice of components of the circuit. However, there is further potential for optimization, by optimizing the activation of the circuit arrangement.

Currently, silicon carbide power semiconductors, which are connected in parallel for adaptation to the performance, are increasingly being used for traction converters. These parallel-connected power semiconductors form a topological switch and are activated using a driver T1, as illustrated schematically in FIG. 1. Here, a topological switch with two parallel-connected MOSFETs 10, 20 and a driver T1 is illustrated. MOSFETs with gate G, source S and drain D are used as power semiconductors 10, 11, 20, 21 in the following description.

Each individual power semiconductor 10, 20, 11, 21 has parasitic capacitances Cres, CDS, CGS, which must be subjected to charge reversal during each switching operation. Discharge processes of the parasitic capacitances Cres, CDS, CGS during the switch-on operation are illustrated in FIG. 2. The size of the capacitances Cres, CDS, CGS depends on a plurality of factors and definitively determines the switching losses. The greater the number of power semiconductors 10, 20, 11, 21 connected in parallel or the larger the chip area, the larger the capacitances Cres, CDS, CGS become. In addition, the semiconductor material used plays a decisive role. As silicon carbide has a critical field strength three times that of silicon, the space charge region of this power component also only extends to one third the length. This in turn leads to a parasitic capacitance Cres, CDS, CGS which is three times higher. The capacitance is exponentially dependent on the applied voltage and in this case falls by more than 80% during the consumption of the first 10% of the nominal voltage. By contrast, the stored charge increases continuously.

During the switch-on operation, the capacitances CDS and Cres are discharged via the channel of the power semiconductor 10, 20, 11, 21. In this case, virtually the entire DC link voltage is applied, which leads to losses. The losses reduce the efficiency and the range of battery electric cars. The design point in this case is generally the WLTP (Worldwide Harmonized Light Duty Vehicles Test Procedure). Here in particular, there are areas in which the vehicle is stationary, e.g. at traffic lights. No current is flowing in this state, but the activation, that is to say switching on and switching off, of the power switches nonetheless still takes place for diverse reasons. Overall, these areas form approx. 13% of the overall cycle. Here, the losses are mainly predetermined by the purely capacitive charge-reversal losses. Low-loss charge-reversal therefore has a great influence on the rechargeable battery and thus on the range of the vehicle.

In order to achieve low-loss charge-reversal, it is proposed to divide the power semiconductors 10, 20, 11, 21 into a plurality of groups, preferably two groups 1 and 2, as illustrated in FIG. 3. The first group 1 is advantageously chosen such that as few power semiconductors 10, 11 as possible are part of the group. Advantageously, at least one power semiconductor 10, 11 is in this first group 1. The selection of which power semiconductors 10, 11 are part of the first group 1 advantageously takes place on the basis of the arrangement of the power semiconductors 10, 20, 11, 21 on the printed circuit board. Advantageously, the power semiconductors 10, 20, 11, 21 associated with the first group 1 are connected in the commutating circuit with the lowest possible impedance. It is also advantageous if the semiconductor area of the first group 1 is smaller than the semiconductor area of the second group 2. Moreover, it is possible to employ a criterion that the first group 1 is optimized for low losses in the WLPT and the second group 2 is selected such that the second group can represent a maximum output of the motor. In principle, the semiconductor area can be chosen depending on the current demand, which in turn depends on the performance of the vehicle or the rechargeable battery.

The first group 1 further has a driver T1, which provides dynamic activation, depending on the operating point of the circuit.

The second group 2 consists of the rest of the power semiconductors 20, 21, which are required for power transfer. This second group 2 as well can be activated using a separate driver T2, which provides dynamic activation, depending on the operating point of the circuit. Alternatively, the second group 2 is coupled to the first group 1 via a passive network and optimized to a predetermined operating point, in order to provide a time-delayed activation. In this case, a resistor may for example be provided as delay element.

The first group 1 is coupled to the second group 2 via decoupling inductances LAbk.1 and LAbk.2. The size of the decoupling inductances LAbk.1 and LAbk.2 can for example be adjusted by the length of electrical (connection) lines or the geometry of the arrangement of the power semiconductors 10, 20, 11, 21. However, a physical component, e.g. in the form of an inductor, may also be provided.

The time delay is realized in that during the switch-on operation, initially the driver T1 for the first group 1 is switched to the positive supply voltage. A voltage commutation of the phase takes place as a result. The output capacitances of the second group 2 are subsequently discharged by the power semiconductors 10, 11 of the (generally low-impedance) first group 1. As the discharge currents of the second group 2 arrive delayed due to the decoupling inductances LAbk.1 and LAbk.2, the discharge takes place with voltage already having been output in the first group 1. The charge-reversal losses can be reduced as a result.

In principle, power semiconductors of all types, e.g. IGBT, MOSFET, etc., and all materials, e.g. SiC, Si, GaN, can be used in the circuit arrangement, wherein the circuit arrangement is advantageous in particular for SiC power semiconductors.

Due to the proposed circuit arrangement and the activation process of the circuit arrangement, an inverter which is used e.g. as drive converter or traction converter can be achieved in which the switching losses during switching between semiconductor switches are reduced. The circuit arrangement for which the process for activation is proposed can be used in an inverter of an electronic module for activating the electric drive of a vehicle equipped with an electric drive. Moreover, electrified axles can be driven by the electric drive.

An electronic module in the context of this disclosure is used for operating an electric drive of a vehicle, particularly an electric vehicle and/or a hybrid vehicle, and/or electrified axles. The electronic module comprises a DC/AC inverter. In addition, the electronic module may comprise an AC/DC rectifier, a DC/DC converter, transformer and/or a different electrical converter or a part of such a converter or may be a part thereof. In particular, the electronic module is used to supply current to an electric machine, for example an electric motor and/or a generator. A DC/AC inverter is preferably used to generate a polyphase alternating current from a direct current generated by means of a DC voltage of an energy source, such as a battery or a rechargeable battery.

LIST OF REFERENCE SIGNS

10, 20, 11, 21 Power semiconductors
LAbk.1, LAbk.2 Decoupling inductances $C_{res}$, $C_{DS}$, $C_{GS}$ Parasitic capacitances T1, T2 Drivers G, S, D Gate, source, drain of the power semiconductor (MOSFET)

The invention claimed is:

1. A method of activating a circuit arrangement for power semiconductors of an inverter with at least one phase having at least two power semiconductors connected in parallel with one another by a passive network, wherein the at least two power semiconductors are divided into two groups, wherein the method comprises:

dynamically activating a first group of the at least two power semiconductors with a first driver during a switch-on operation, wherein the dynamic activation of the first group depends on a first operating point of the circuit arrangement; and delaying activation of a second group of the at least two power semiconductors relative to the first group via the passive network, wherein the passive network comprises decoupling inductances, and wherein at least one of the decoupling inductances is a physical component in a form of an inductor and distinct from an electrical connection line.

2. The method according to claim 1, further comprising:

delaying an arrival of discharge currents of at least one power semiconductor of the second group to at least one power semiconductor of the first group with the at least one decoupling inductance between the first group and the second group.

3. The method according to claim 2, wherein a total semiconductor area of the first group is smaller than a total semiconductor area of the second group.

4. A circuit arrangement, wherein the circuit arrangement is part of an inverter of an electronic module for activating an electric drive of a vehicle equipped with the electric drive, the circuit arrangement comprising:

at least two power semiconductors connected in parallel with one another by a passive network, wherein the at least two power semiconductors are divided into a first group and a second group; and a separate first driver of the first group, wherein the first driver is configured to switch on the first group prior to the second group being switched on, wherein the first driver is configured to dynamically activate the first group according to a first operating point of the circuit arrangement;

wherein the passive network delays activation of the second group relative to the first group, wherein the passive network comprises decoupling inductances, and wherein at least one of the decoupling inductances is a physical component in a form of an inductor and distinct from an electrical connection line.

5. The circuit arrangement according to claim 4, wherein at least one power semiconductor of the first group is connected in a commutating circuit with low impedance.

6. The circuit arrangement according to claim 4, wherein the first group is coupled to the second group via decoupling inductances.

7. An inverter comprising the circuit arrangement according to claim 4.

8. An electric drive of a vehicle, comprising:

an electronic module for activating an electric drive, wherein the electric drive comprises the inverter according to claim 7.

9. A vehicle comprising the electric drive according to claim 8.

10. The circuit arrangement according to claim 4, wherein at least one power semiconductor of the first group is configured to discharge parasitic capacitance discharge currents of at least one power semiconductor of the second group.

11. A circuit arrangement, wherein the circuit arrangement is part of an inverter of an electronic module, the circuit arrangement comprising:

at least two power semiconductors connected in parallel with one another by a passive network, wherein the at least two power semiconductors are divided into a first group and a second group; and a separate first driver of the first group, wherein the first driver is configured to switch on the first group prior to the second group being switched on, wherein the passive network delays activation of the second group relative to the first group, wherein a total semiconductor area of the first group is smaller than a total semiconductor area of the second group, wherein the passive network comprises decoupling inductances, and wherein at least one of the decoupling inductances is a physical component in a form of an inductor and distinct from an electrical connection line.

12. The circuit arrangement according to claim 11, wherein the delay of activation of the second group relative to the first group depends on an optimized operating point of the circuit arrangement.

13. The circuit arrangement according to claim 11, wherein at least one power semiconductor of the first group is configured to discharge parasitic capacitance discharge currents of at least one power semiconductor of the second group.

* * * * *